(12) United States Patent
Branch et al.

(10) Patent No.: US 7,071,692 B2
(45) Date of Patent: Jul. 4, 2006

(54) RADIO FREQUENCY SHIELD FOR NUCLEAR MAGNETIC RESONANCE PROCEDURES

(75) Inventors: Craig A. Branch, Cornwall, NY (US); Joseph A. Helpern, Cornwall, NY (US)

(73) Assignee: Advanced Veterinary Technologies, Inc., New Windsor, NY (US)

( * ) Notice: Subject to any disclaimer, the term of this patent is extended or adjusted under 35 U.S.C. 154(b) by 0 days.

(21) Appl. No.: 10/826,260

(22) Filed: Apr. 19, 2004

(65) Prior Publication Data

US 2004/0196043 A1 Oct. 7, 2004

Related U.S. Application Data

(62) Division of application No. 09/985,473, filed on Nov. 2, 2001.

(51) Int. Cl.
*G01V 3/00* (2006.01)

(52) U.S. Cl. .................................. 324/318; 324/319
(58) Field of Classification Search ................ 324/318, 324/319, 322, 309, 307, 300
See application file for complete search history.

(56) References Cited

U.S. PATENT DOCUMENTS

| 4,411,270 | A | * | 10/1983 | Damadian ................... 600/410 |
| 4,613,820 | A | * | 9/1986 | Edelstein et al. ........... 324/318 |
| 4,995,335 | A | | 2/1991 | Wright |
| 5,192,911 | A | * | 3/1993 | Hill et al. .................... 324/322 |
| 5,383,425 | A | | 1/1995 | Bleacher |
| 5,388,580 | A | | 2/1995 | Sullivan et al. |
| 5,738,045 | A | | 4/1998 | Bleacher |
| 6,084,409 | A | | 7/2000 | Zebelein et al. ............ 324/318 |
| 6,138,302 | A | | 10/2000 | Sashin et al. |
| 6,275,723 | B1 | | 8/2001 | Ferris et al. |
| 6,611,702 | B1 | | 8/2003 | Rohling et al. ............. 600/415 |

OTHER PUBLICATIONS

U.S. Appl. No. 10/826,321, filed Apr. 19, 2004, Branch et al.
U.S. Appl. No. 10/826,297, filed Apr. 19, 2004, Branch et al.

* cited by examiner

*Primary Examiner*—Brij B. Shrivastav
(74) *Attorney, Agent, or Firm*—Covington & Burling

(57) ABSTRACT

An apparatus and method for providing RF shielding for performing nuclear magnetic resonance ("NMR") procedures, comprising a radio-opaque holder in combination with radio-opaque magnet components to form an RF shield around a patient undergoing an NMR procedure. In embodiments, a radio-opaque holder having a radio-opaque bottom portion and a radio-opaque canopy is adjoined to an NMR magnet having a radio-opaque cryostat and a radio-opaque service end cap to form an RF shield. A patient is placed on a patient support unit located in the holder bottom portion. The patient support unit, including the patient, is then inserted into the cavity of the NMR magnet and a canopy is placed on top of the bottom portion of the holder. An RF shield is thus created comprising the canopy, the bottom portion, the cryostat of the magnet, and an end cap on the service end of the magnet.

6 Claims, 4 Drawing Sheets

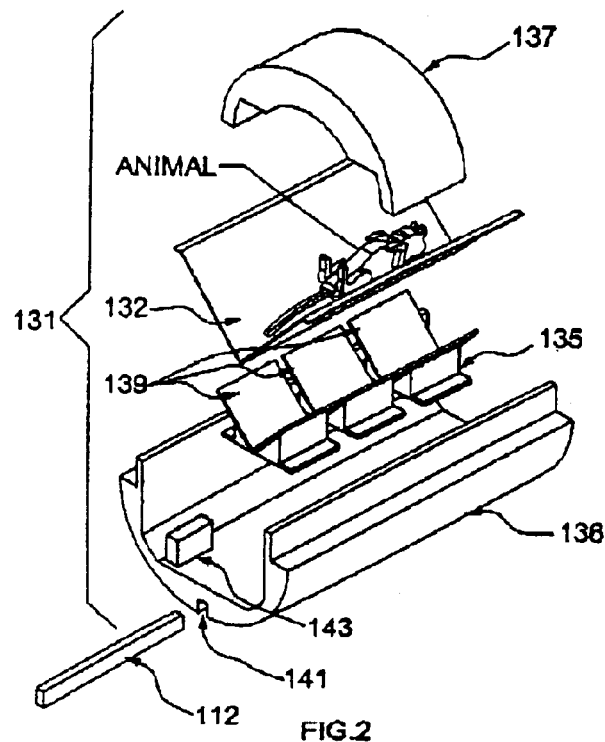
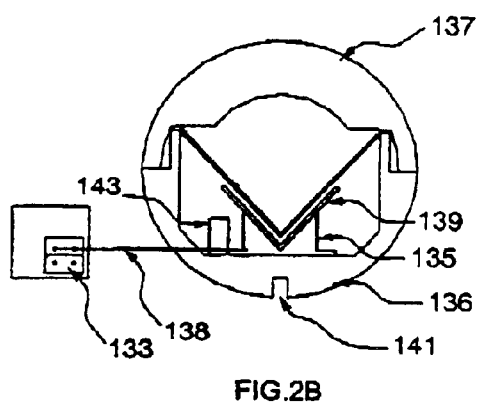
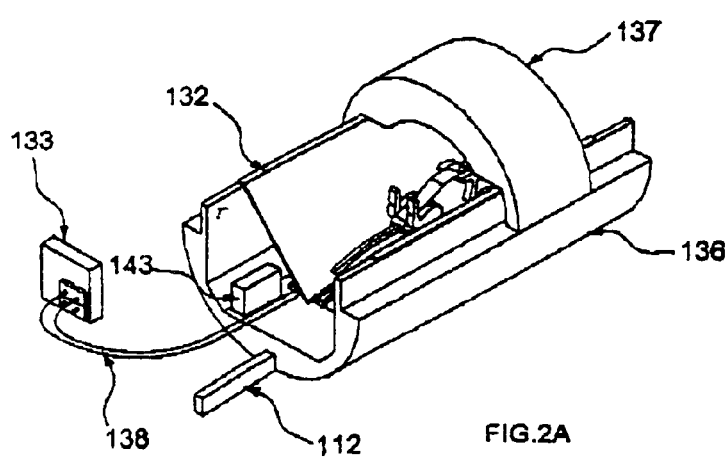

RADIO FREQUENCY SHIELD FOR NUCLEAR MAGNETIC RESONANCE PROCEDURES

BACKGROUND OF THE INVENTION

1. Field of the Invention

The present invention relates to nuclear magnetic resonance ("NMR") procedures, such as magnetic resonance imaging ("MRI"), magnetic resonance angiography ("MRA") and magnetic resonance spectroscopy ("MRS"). More specifically, the present invention relates to a system, method and apparatus for shielding against unwanted radio frequency signals when performing an NMR procedure. The invention is designed for clinical veterinary applications, but could be employed for any NMR application.

2. Related Art

NMR technology has provided physicians with the ability to view the inside of a human patient's body in order to form accurate diagnoses and prescribe proper treatments. Because NMR procedures rely on the detection of RF signals with low signal-to-noise ratios, NMR procedures are typically conducted in environments that are substantially free of unwanted RF signals. The usual manner by which a "clean" environment (that is, an environment substantially free of unwanted RF noise) is achieved is by shielding the room in which the NMR procedure takes place. This approach involves building a contiguous radio-opaque screen, known as a faraday cage, to encompass an entire room—including floors, ceilings, and walls. All openings into the room, such as windows, doors, and penetrations for power supply and other cables, are formed in a manner that does not impair the integrity of the RF shield.

Doctors who practice veterinary medicine can benefit from the diagnostic capabilities of NMR technology. However, due to the cost associated with obtaining NMR equipment and providing a dedicated, RF-shielded room for the procedure, veterinarians typically are unable to offer NMR procedures to their patients. Accordingly, NMR procedures are not readily available to most non-human patients; indeed, pet owners wishing to have NMR procedures conducted on their pets normally have to pay to have their pets taken after business hours to hospitals or offices having NMR equipment for use with humans.

Thus, there is a need for a cost-effective way to provide doctors who practice veterinary medicine with the ability to offer NMR procedures to their patients.

SUMMARY OF THE INVENTION

Features and Advantages

The following features characterize some, but not necessarily all, embodiments of the present invention.

One feature of an embodiment of the present invention is that it reduces the cost of NMR procedures by eliminating the need for a dedicated, RF-shielded room for performing such procedures. By forming the RF shield around the patient and RF coils, as opposed to around the NMR room itself, embodiments of the present invention facilitate the use inside the NMR room of electronic equipment to support NMR procedures as well as of AC (rather than DC) lighting fixtures.

Another feature of an embodiment of the present invention is that it enables the patient space to be climactically controlled, thus facilitating the maintenance of the patient's temperature.

Another feature of an embodiment of the present invention is that it provides an improved support unit for holding a non-human patient during an NMR procedure.

Another feature of an embodiment a support unit of the present invention is that it provides the ability to modify an RF coil configuration for an anesthetized patient to image different parts of the patient's body without moving the patient.

Further features and advantages will become apparent following review of the detailed description set forth below or in the course of practicing the invention.

SUMMARY

In summary, the invention comprises a radio-opaque holder for holding a patient support unit supporting a patient about to undergo an NMR procedure, and for providing, in conjunction with shielding provided by an NMR magnet, RF shielding for the procedure. In an embodiment, the patient support unit can be moved from the holder into the magnet when the holder adjoins the magnet. In embodiments, the holder may comprise a canopy and a bottom portion such that when the canopy is placed over the bottom portion, a radio-opaque enclosure—which may be substantially cylindrical in shape—is formed around the patient support unit. In an embodiment, the patient end of the holder is enclosed with radio-opaque material, for example as a result of the placement of the canopy on top of the bottom portion of the holder, or as a result of use of a separate patient end cap. In an embodiment, the magnet end of the holder is open, and is configured so that, when the holder is adjoined with the opening of the NMR magnet, the RF shielding associated with the magnet ("magnet-RF-shielding") and RF shielding associated with the holder ("holder-RF-shielding") combine to form a continuous RF shield.

The holder may be formed to operate with existing NMR magnets, or specialized NMR magnets may be produced to operate together with the holder as a system. For a magnet whose construction provides sufficient RF shielding (as, for example, a superconducting magnet whose inner diameter comprises a cryostat made of radio-opaque material), the shield may be completed by the RF shield provided by the magnet itself combined with a radio-opaque service end cap that covers the service end of the magnet. In such embodiments, the result is a cylindrical RF shield fully encompassing the patient, which has a length of approximately the length of the cavity of the magnet, plus the length of the holder.

The holder may comprise a base unit, which may enable the holder to be moved (for instance, by means of wheels or rollers) to adjoin the magnet in a manner that aligns the bottom portion of the holder with the bore of the magnet to facilitate insertion of the patient into the magnet cavity. The holder may be attachable to the magnet by means of a docking mechanism, for example.

In embodiments, the bottom portion of the holder is designed to include within it a patient support unit, typically on a longitudinal track formed on the bottom portion of the holder that can be aligned with a similar horizontal track in the bore of the magnet. The alignment of the tracks facilitates movement of the patient support unit from the holder into the magnet for an NMR procedure.

The patient support unit may be made of a material that slides well on the bottom portion of the holder as well as in the bore of the magnet. A suitable combination of materials is, for example, Teflon-coated fiberglass for the patient support unit, and Teflon-coated carbon fiber for the bottom portion of the holder and the bore of the magnet (which may be a cryostat). In embodiments, the patient support unit includes a bed that is configured to hold an animal, preferably in an inverted position. The bed may be formed substantially to match the curvature of the animal's spine, and different-sized and different-shaped beds (in some embodiments, on different patient support units) may be used to accommodate different sizes and shapes of animals. The patient support unit may include RF transmitter antennas and receiver antennas, such as RF coils, that provide RF energy used in the NMR procedure. In embodiments, the bed includes lower RF coils as well as connectors for upper RF coils for use forming, in conjunction with the lower RF coils, volume coils for imaging parts of the patient's body such as the head and abdomen. In embodiments, the RF coils are movable with respect to the bed, to facilitate imaging different parts of the patient's body.

The patient support unit of the invention may be used in conjunction with the holder of the invention, in which case the holder-RF-shielding and the magnet-RF-shielding provide RF shielding for the NMR procedure. The patient support unit of the invention can also be used with holders that do not comprise RF shielding, or with NMR magnets that do not comprise RF shielding, as, for example, in cases where a faraday cage provides RF shielding for the NMR room.

The invention also includes a method for performing an NMR procedure using the apparatus and system described above and in this specification.

BRIEF DESCRIPTION OF THE DRAWINGS

FIG. 2 depicts the components that make up a patient support unit of an embodiment of the invention.

FIG. 2A depicts an embodiment of a patient support unit of the invention.

FIG. 2B depicts an embodiment of a patient support unit viewed from the patient end.

DETAILED DESCRIPTION OF THE DRAWINGS

Definitions

As used in this specification, the following terms have the following associated meanings.

"NMR procedure" refers to any procedure that relies on nuclear magnetic resonance. Examples include, but are not limited to, magnetic resonance imaging ("MRI"), magnetic resonance angiography ("MRA"), and magnetic resonance spectroscopy ("MRS").

"Radio-opaque" refers to a property of a material that enables it to block RF energy. A material described in this patent application as "radio-opaque" need not block all RF energy; it merely must block RF energy to an extent that those with skill in the art would recognize it as providing sufficient RF shielding to prevent unwanted RF signals from interfering with an NMR procedure. Radio-opacity depends on a number of factors, including the type of the material, as well as the thickness and density of the component that uses the material, as well as the sensitivity and functioning of the equipment used to conduct the NMR procedure. Examples of materials that are radio-opaque in the frequency ranges typically used for NMR procedures are metals such as copper, aluminum, stainless steel, beryllium, and titanium. A semi-transparent radio-opaque shield may be formed of a radio-opaque metal screen, such as a copper screen, encased in acrylic.

"Non-ferromagnetic" refers to a material that is substantially comprised of materials other than ferromagnetic materials (materials which may be attracted to a magnet). Ferromagnetic materials are generally not used in the NMR environment because they will be attracted to the NMR magnet.

"Holder" refers to a member that supports, and (in some embodiments) surrounds, a patient support unit, and in embodiments of the invention may comprise a bottom portion, a canopy, a patient end cap, and a base, as described in more detail below with reference to FIGS. 1, 1A, 1B and 1C.

"Magnet end" (of a holder) refers to the end of the holder that is adjoined to the magnet in an NMR procedure.

"Patient end" (of a holder) refers to the opposite end of the holder from the "magnet end."

"Patient end" (of a magnet) refers to the end of the magnet cavity into which the patient is inserted.

"Service end" (of a magnet) refers to the opposite end of the magnet cavity from the patient end.

"Magnet-RF-shielding" refers to RF shielding associated with the NMR magnet, which may include RF shielding provided by the magnet cryostat and/or RF shielding provided by a radio-opaque service end cap placed over the service end of the magnet.

"Holder-RF-shielding" refers to RF shielding associated with the holder of the invention, which may include shielding provided by the bottom portion of the holder, the canopy, and/or a patient end cap.

"Animal" refers to nonhuman animals. While the embodiments of the invention described in this specification relate to providing NMR procedures for non-human animals, the present invention can also be used for providing NMR procedures to humans.

Detailed Description

Figure 1:
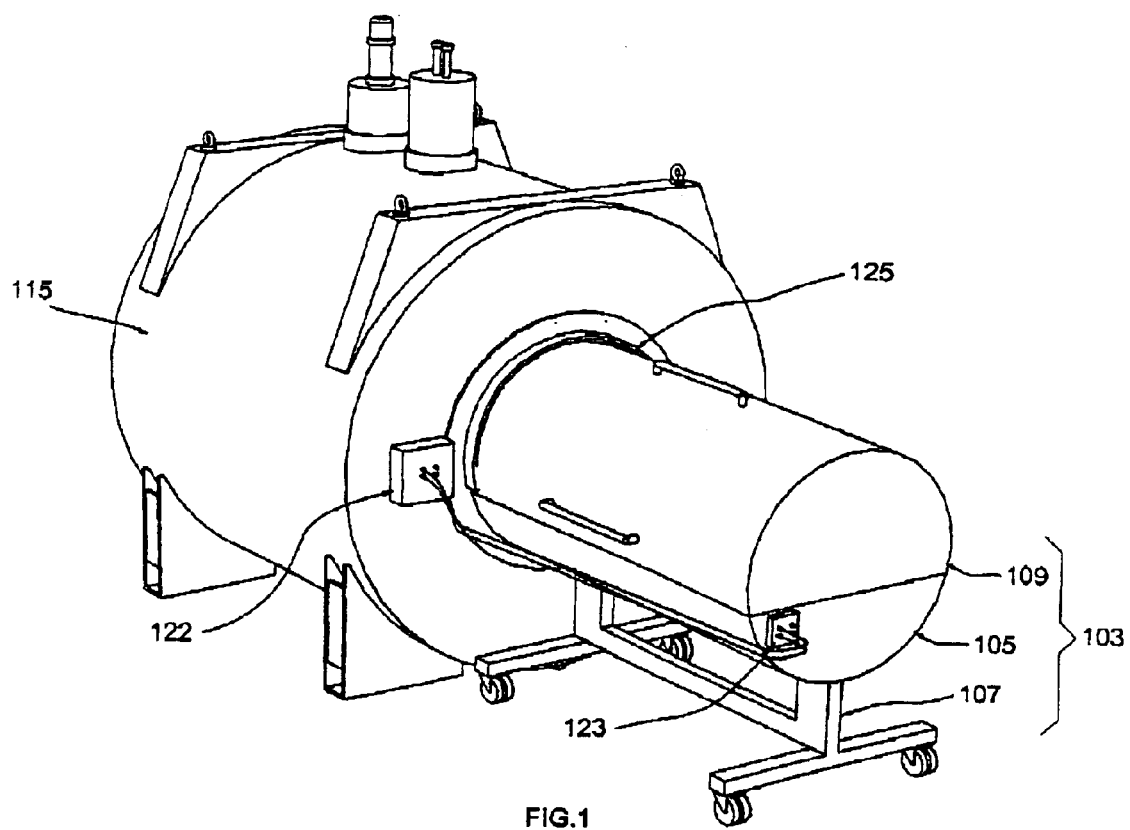
FIG. 1 depicts an embodiment of a holder of the invention, including a canopy, as it relates to an NMR magnet during an NMR procedure.
Figure 1A:
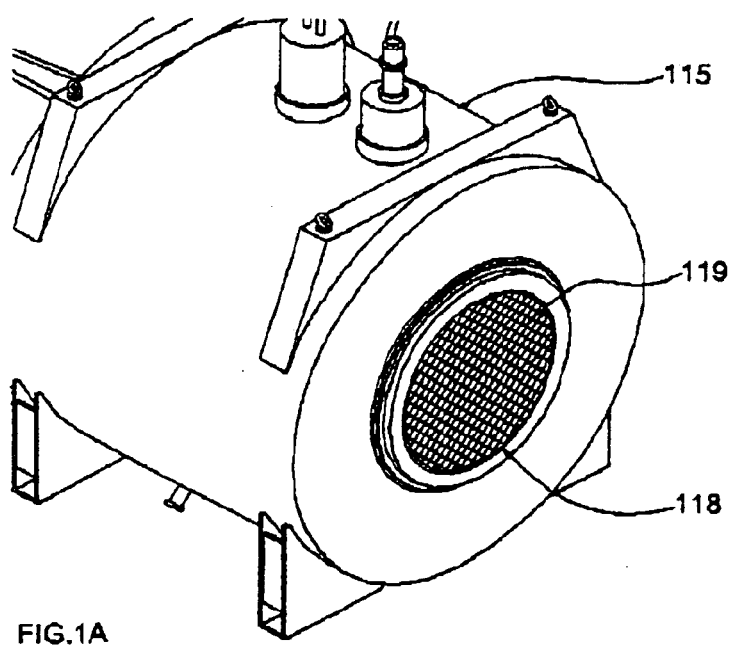
FIG. 1A provides an illustration of a service end cap attached to the service end of an NMR magnet.
Figure 1B:
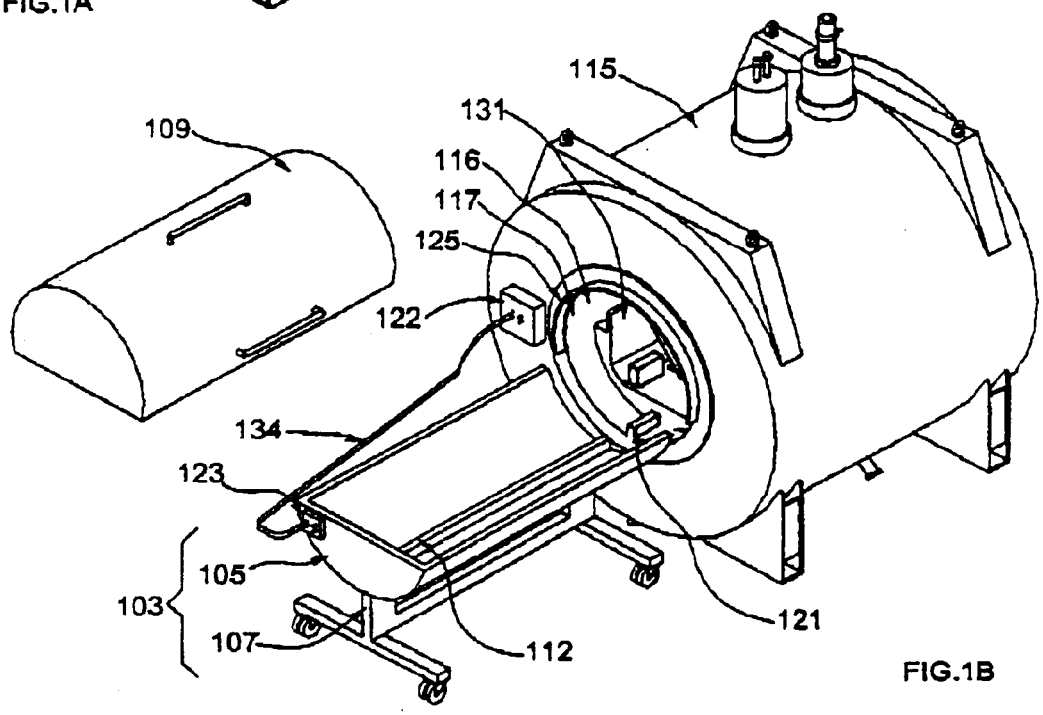
FIG. 1B depicts an embodiment of a holder of the invention, with the canopy removed, as it relates to an NMR magnet during an NMR procedure.

An exemplary embodiment of the present invention will now be described. Referring to FIGS. 1, 1A and 1B, a system for use in an NMR procedure comprises a holder 103 (comprising bottom portion 105 and canopy 109) and a magnet 115 and associated components (including cryostat 117 and service end cap 119). Bottom portion 105, canopy 109, cryostat 117 and service end cap 119 are all radio-opaque. When the holder 103 is adjoined to the magnet 115 and service end cap 119 is put in place at the service end 118 of magnet 115, a substantially complete RF shield is formed, consisting of canopy 109, bottom portion 105, cryostat 117, and service end cap 119. The term "adjoined to," as used in this specification, refers to the position of holder 103 in relation to magnet 115 such that an RF shield is formed from holder-RF-shielding and magnet-RF-shielding.

In the embodiment depicted in FIGS. 1 and 1B, bottom portion 105 contains or is made of a non-ferromagnetic radio-opaque material. As depicted in FIG. 1B, bottom portion 105 includes longitudinal track 112 for engaging a patient support unit, as depicted in FIGS. 2A and 2B. As shown in FIG. 1B, when bottom portion 105 is adjoined to magnet 115, track 112 of bottom portion 105 aligns with track 121 of magnet 115, to facilitate smooth transfer of the patient support unit from bottom portion 105 to magnet cavity 116. Bottom portion 105 may be attached to or integral with base 107, which may be mounted on wheels or casters for moving holder 103 to and from magnet 115.

In an embodiment, canopy 109 (depicted in FIGS. 1, 1B and 1C) is constructed of or contains a radio-opaque material such as copper or aluminum. In an embodiment, canopy 109 is semi-transparent to facilitate observing the patient during preparation and during an NMR procedure. A suitable, radio-opaque semi-transparent canopy 109 can be fabricated by encasing a radio-opaque metallic screen, such as a copper screen, in acrylic. Canopy 109 can be a separate component of the holder 103, which can be placed on top of bottom portion 105 to form a cylindrical shield. In an embodiment, canopy 109 can be placed on bottom portion 105 without locking canopy 109 into position. In some embodiments, the edges of canopy 109 comprise electrically conductive screen or other electrically conductive connections so that a pressure applied to the bottom surface of the canopy 109 and the corresponding top surface of bottom portion 105 will produce an electrical contact, thereby completing an RF shield composed of bottom portion 105 and canopy 109. In some embodiments, clamps (not depicted) attached to bottom portion 105 swing upward to engage canopy 109, thereby providing the pressure useful in maintaining electrical contact.

In alternative embodiments (not depicted), the canopy can be hinged to either the magnet or the bottom portion of the holder. In one example of such an embodiment, the canopy comprises two halves, hinged to opposite sides of the bottom portion of the holder, such that swinging the halves upward results in formation of the canopy. In such embodiments, the holder may have a base in the shape of an inverted T, similar to that of base 107 depicted in FIGS. 1B and 1C, to accommodate the canopy halves when the canopy is not in use. In embodiments where the canopy is hinged to either the magnet or the holder, the hinges and associated components can also provide electrical contact useful in completing the RF shield.

Figure 1C:
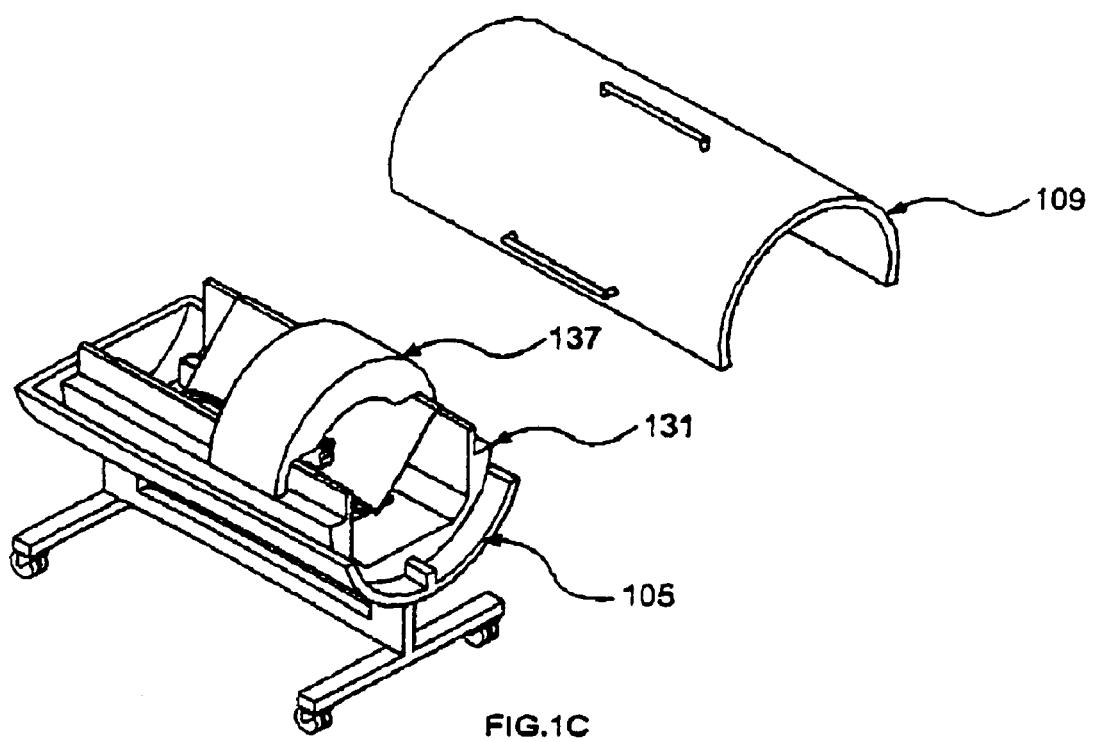
FIG. 1C depicts an embodiment of a holder of the invention holding a patient support unit of the invention.

In the embodiments depicted in FIGS. 1, 1B, and 1C, canopy 109 is shaped so that when canopy 109 and bottom portion 105 are attached, they form a cylinder that is closed at the patient end and open at the magnet end. The shape of the canopy is not critical to the invention; it merely must provide room for patient support unit (such as patient support unit 131 depicted in FIG. 1C), including the patient and any RF coils.

In other embodiments (not depicted), the RF shield formed by a canopy and a bottom portion is a cylinder that is open at both ends. In such embodiments, the patient end of the cylinder may be covered with a patient end cap to complete the RF shield. Such a patient end cap may be made of radio-opaque metal, or of a radio-opaque metallic screen, such as a copper screen, encased in acrylic, or other radio-opaque materials. In such embodiments, the RF and physiological connections to the patient end cap may be routed through apertures in the patient end cap. The patient end cap can be attached to the canopy or the bottom portion, or both, by means of hooks, clasps, clamps, clips, screws, bolts, hinges, and other similar means.

The holder 103 of this invention can be designed to operate with existing NMR magnets, or the holder 103 and magnet 115 can be designed and built as a system. In the embodiment depicted in FIG. 1, magnet 115 is cylindrical in shape, and has a cylindrical magnet cavity 116 extending through the length of magnet 115. Magnet 115 may be a superconducting magnet, an electromagnet, or a permanent magnet.

In the case of a superconducting magnet, as depicted in FIG. 1B, the magnet 115 may have a cylindrical cryostat 117 formed on its inner diameter. Cryostat 117 typically holds a cryogen, such as liquid helium, in which the superconducting magnet wire is contained. In embodiments of the present invention, cryostat 117 is made of radio-opaque material and provides sufficient RF shielding to be used as a portion of the RF shield of the present invention. Because cryostats made of radio-opaque stainless steel are features of many existing NMR magnets, it may not be necessary to modify such magnets in order for them to operate with the holder of the present invention.

A holder 103 according to the present invention can also be used with an NMR magnet 115 that has a cryostat 117 that is not made of radio-opaque material, or an NMR magnet, such as a permanent magnet, that does not have a cryostat. In the case of a magnet that does not have a cryostat, a radio-opaque sleeve (not depicted), constructed, for example, of a radio-opaque screen stretched over a cage structure or cylinder (such as a tube) formed from non-ferromagnetic materials, can be inserted into the cavity 116 of the magnet 115 to provide a radio-opaque shield. In an embodiment, the radio-opaque sleeve is open at its service end, and the sleeve combines with service end cap 119 to complete the RF shield within the magnet 115. In another embodiment, the radio-opaque sleeve has a closed end, and use of service end cap 119 is optional.

In an alternative embodiment that can be used where the NMR magnet 115 does not have a cryostat 117, an RF shield, for example a copper screen, can be provided on the outside of the magnet 115. In such an alternative embodiment, the RF shield should be configured so that it surrounds magnet 15 (except for the opening of magnet cavity 16). In such an embodiment, the screen could be connected, and electrical contact provided, to holder 103 at the patient end of magnet 115.

In some embodiments, the RF shield for the NMR procedure can be formed without RF shielding provided by the holder. For example, in some cases, the NMR magnet is of sufficient length to permit placement of the patient into the magnet without the patient or patient support unit extending out of the opening of the magnet. In such cases, a radio-opaque RF screen similar to the service end cap 119, with penetrations for electrical lines for RF coils and monitoring devices, can be placed over the opening at the patient end of the magnet to complete the RF shield for the NMR procedure. Such a radio-opaque screen may be attached or attachable to the patient support unit as well as to the magnet. In other embodiments, the radio-opaque bore may be extended to a length sufficient to achieve the same purpose, for example by use of a radio-opaque cylinder of the same diameter as the bore of the magnet, which may be integral with or attachable to the magnet. In such an embodiment, the RF shield may be completed by covering the patient end of the radio-opaque cylinder with a radio-opaque RF screen similar to the service end cap 119. In some embodiments, the radio-opaque cylinder can support any portion of the patient support unit that extends out of the opening of the magnet. In other embodiments, a radio-opaque cylinder may be attached to or an integral part of the patient support unit. In such embodiments, the radio-opaque cylinder may have a radio-opaque base at the patient end, such that when the radio-opaque cylinder is connected to the magnet, a substantially complete RF shield comprising RF shielding provided by the radio-opaque cylinder, and magnet-RF-shielding, is formed. In some embodiments that do not rely on the holder to provide RF-shielding, the magnet has associated with it, for example as an integral part or as a removable attachment, a ledge for supporting any part of the patient support unit that extends out of the magnet.

In the embodiment depicted in FIG. 1A, magnet 115 has associated with it a service end cap 119 for providing RF shielding over the opening at the service end 118 of magnet 115. Service end cap 119 may be made of non-ferromagnetic metal, such as stainless steel, aluminum, or copper, or metal screen such as copper screen, and may include apertures for gradient and imaging cables. Service end cap 119 can be attached to the service end 118 of magnet 115 by means of hooks, clasps, clamps, clips, screws, bolts, hinges, and other similar means.

In the embodiment depicted in FIG. 1B, magnet 115 includes RF seals 125, to provide an electrical connection between holder 103 and magnet 115 to ensure the formation of a continuous RF shield.

In embodiments of the present invention, magnet 115 also has a docking mechanism (not depicted) for engaging with a docking mechanism (not depicted) on holder 103 to dock holder 103 to magnet 115. The docking mechanisms align holder 103 with magnet cavity 116, and track 112 with track 121 (depicted in FIG. 1B), and ensure proper placement of the holder 103 in relationship to the magnet cavity 116, thus facilitating easy transfer of the patient support unit 131 into magnet cavity 116.

FIGS. 2 and 2A depict an embodiment of patient support unit 131, comprising bed 132, bottom section 136, RF coil block 135, lower RF coils 139 mounted on RF coil block 135, and upper RF coil 137. Bed 132 is made of or coated with a material that is suitable for holding an animal, for example, an easily cleanable, waterproof material that also provides comfort and stability to the animal. Various plastics and non-conductive materials, including but not limited to fiberglass, Teflon or polyvinyl chloride, are suitable for this application. In the embodiment depicted in FIG. 2A, bed 132 is an integral part of bottom section 136 of patient support unit 131. In other embodiments, bed 132 simply rests on bottom section 136 of patient support unit 131; in still other embodiments, bed 132 removably attaches to bottom section 136 of patient support unit 131.

Bed 132 is shaped to accommodate an animal. In an embodiment, bed 132 is shaped to accommodate the curvature of the animal's spine, in order to facilitate holding the animal in an inverted position. Thus, bed 132 may have a V-shaped cross section, a U-shaped cross section, or any other cross section that may be suited to hold a particular animal. The V-shaped bed used in the embodiments depicted in FIGS. 2, 2A and 2B accommodates the spine of many animals, such as many types of cats and dogs, such that the spine of the inverted animal is positioned substantially in or near the vertex of the "V", and therefore in close proximity to lower RF coils 139—which, as described below, may also have V-shaped cross-sections—for optimal imaging.

In the embodiment depicted in FIG. 2, patient support unit 131 has associated with it upper RF coils 137 (of which only one is depicted) and lower RF coils 139. In the embodiment depicted in FIGS. 2 and 2A, lower RF coils 139 are mounted on RF coil block 135, which conforms to the shape of bed 132. In the embodiment depicted in FIG. 2, RF coil block 135 is V-shaped to conform to V-shaped bed 132. In an embodiment, RF coil block 135 is movable in a longitudinal direction, for example along a track (not depicted) formed on the bottom section 136 of the patient support unit 131. Thus, for example, when the patient is placed on bed 132, lower RF coils 139 can be moved forward or backward such that an image of the desired portion of the patient's spine or abdomen can be obtained. In one embodiment, RF coil block 135 can be moved by manipulation of manual controls on the outside of holder 103, where the manual controls comprise a pulley and wheel system. In another embodiment, RF coil block 135 can be moved back and forth by means of a push-pull stick. The movable RF coil arrangement of embodiments of the invention provides one way for the NMR operator to obtain images of different parts of a patient's body, without moving the patient.

In the embodiment depicted in FIG. 2, lower RF coils 139 may function as a plurality of separate coils, or some or all of them may be connected in series to operate as an array of coils. In some embodiments, lower RF coils 139 comprise parts mounted on each side of RF coil block 135. For example, in some embodiments, lower RF coils 139 are non-planar coils with two loops, such as figure-eight-shaped coils, such that one loop of the coil is mounted on one side of RF coil block 135, and the other loop of the coil is mounted on the opposite side of RF coil block 135. Accordingly, in some embodiments, for a V-shaped bed 132 and V-shaped RF coil block 135, the lower RF coils 139 have a V-shaped cross-section, and are thus well-positioned for imaging the spine of an animal in or near the vertex of the "V" of the V-shaped bed. In such a configuration, non-planar lower coils 139 may function as partial volume coils, because they partially surround the object being imaged. In some embodiments, lower RF coils 139 comprise parts mounted on only one side of RF coil block 135.

In embodiments of the present invention, each lower RF coil 139 can also be used in combination with a "mate," such as upper RF coil 137, placed above bed 132 to complete a volume coil. In this manner, as depicted in FIG. 2A, the forward lower RF coil 139 combines with upper RF coil 137 to form a volume coil for imaging the head of the patient. In the same manner, lower RF coils 139 can be combined with upper RF coils for forming volume coils for imaging a patient's abdomen, as another example. When used, upper RF coils 137 may be plugged into connections (not depicted) in patient support unit 131, to connect them to the appropriate lower RF coils 139. An upper RF coil 137 may comprise a single coil, or an array of coils. The ability to create new RF coils—such as volume coils—by combining lower RF coils 139 with upper RF coils 137 enables the NMR operator to obtain images of different parts of a patient's body, without moving the patient.

Patient support unit 131 can thus accommodate a wide variety of different RF coil configurations and designs, as will be apparent upon practicing the invention.

In the embodiment depicted in FIG. 2, patient bed 132 includes an aperture or apertures (not depicted) to allow for drainage of the patient's urine or other bodily fluids from the bed into fluid collection container 143.

In the embodiment depicted in FIGS. 2A and 2B, RF, physiological monitoring, and other internal electrical or other lines 138 run from the interior of patient support unit 131, including from RF coils 137 and 139 and from bed 132, to internal electrical panel 133, which connects them to external electrical panel 123 on bottom portion 105 (depicted in FIGS. 1 and 1B). In the embodiment depicted in FIGS. 1 and 1B, external electrical panel 123 is connected, via external lines 134, to magnet electrical panel 122 on magnet 115. Other arrangements for providing connections to the patient support unit will be apparent upon practicing the invention.

In embodiments of the invention, the patient support unit bottom section 136 is shaped substantially to conform to the bottom portion of magnet cavity 116. In the embodiment depicted in FIGS. 1B, 2 and 2A, patient support unit bottom section 136 forms groove 141, which is shaped to receive track 112 of holder bottom portion 105 and track 121 of magnet 115, to allow for sliding of the patient support unit along the tracks in holder bottom portion 105 and magnet 115. In addition, in the embodiment depicted in FIG. 1B, in which magnet cavity 116 is cylindrical, patient support unit 131 is curved at least in part with a curvature that substantially matches that of cavity 116.

In embodiments of the invention, patient support unit bottom section 136 is constructed of a material that allows for optimal sliding within the magnet cavity 116. Good slidability may be achieved when patient support unit bottom section 136 is made of or coated with Teflon-coated fiberglass, and the bore of the magnet cavity 116, or cryostat 117, is made of or coated with Teflon-coated carbon fiber. Appropriately coated materials for these purposes can be obtained from M.T.D. Inc., 24 Slabtown Creek Road, Blairstown, N.J. 07825.

A patient support unit of this invention, such as patient support unit 131 of the embodiment depicted in FIGS. 2, 2A, and 2B, can be used independently of the RF-shielded holder of the invention described above, as, for example, when RF shielding is provided by a faraday cage.

An embodiment of the invention as depicted in FIGS. 1, 1A, 1B, 1C and 2A can be used to conduct an NMR procedure as follows, although the steps need not be performed in the particular sequence, and alternate procedures will be apparent from use of the invention. A patient, typically anesthetized, is placed in an inverted position in bed 132, which is already in patient support unit 131 (as shown in FIG. 2A), which in turn has been placed in holder bottom portion 105 (as shown in FIG. 1C). Optionally, the patient's limbs may be strapped down by means of straps (not depicted) to prevent movement. RF coils 137 and 139 are then positioned appropriately for the NMR procedure to be conducted and the part of the body to be imaged. If not already in place, holder 103 is moved to and docked to magnet 115, in order to facilitate transfer of the patient support unit 131 to magnet 115. If not already in place, service end cap 119 is placed on the service end 118 of magnet 115, in order to complete the portion of the RF shield associated with magnet 115. Patient support unit 131 is then moved, typically manually, from holder bottom portion 105 into cavity 116 of magnet 115, by sliding it from track 112 to track 121. Patient support unit 131 may be inserted partially or fully into the magnet 115, depending on the procedure to be conducted. If patient support unit 131 is partially inserted, the patient end of patient support unit 131 remains partially on track 112 and is supported by holder bottom portion 105. Canopy 109 is placed on top of holder bottom portion 105 to complete an RF shield around patient support unit 131 and the patient. The NMR procedure may then be performed.

CONCLUSION

While various embodiments of the present invention have been described above, it should be understood that they have been presented by way of example only, and not limitation. For example, the present invention is not limited to the physical arrangements or dimensions illustrated or described; the holder need not be cylindrical in form; and, depending on holder design, a patient end cap may or may not be used. Nor is the present invention limited to any particular design or materials of construction. The breadth and scope of the present invention should not be limited to any of the above-described exemplary embodiments, but should be defined in accordance with the following claims and their equivalents.

We claim:

1. An apparatus for use in RF shielding, comprising:
   a holder comprising RF shielding and configured for adjoining a magnet comprising magnet-RF-shielding, such that when the holder is adjoined to the magnet, the RF shielding of the holder and the magnet-RF-shielding form a substantially complete RF shield.

2. The apparatus of claim 1, further comprising a patient support unit configured to support a patient inside the RF shield.

3. The apparatus of claim 1, wherein the holder comprises a support for supporting the patient support unit.

4. The apparatus of claim 3, wherein the holder is attachable to the magnet.

5. The apparatus of claim 2, wherein the holder is attachable to the patient support unit.

6. The apparatus of claim 2, wherein the holder comprises apertures.

* * * * *

UNITED STATES PATENT AND TRADEMARK OFFICE
CERTIFICATE OF CORRECTION

PATENT NO. : 7,071,692 B2
APPLICATION NO. : 10/826260
DATED : July 4, 2006
INVENTOR(S) : Craig A. Branch et al.

It is certified that error appears in the above-identified patent and that said Letters Patent is hereby corrected as shown below:

On the Title page of the patent, under the item 56 References Cited, please add the following omitted U.S. Patent Document:

5,735,278     4/1998     Hoult et al. ...........128/653.2.

Signed and Sealed this

Twentieth Day of March, 2007

JON W. DUDAS
*Director of the United States Patent and Trademark Office*